United States Patent
Norsworthy et al.

(10) Patent No.: US 7,471,226 B2
(45) Date of Patent: Dec. 30, 2008

(54) RADIO FREQUENCY DIGITAL-TO-ANALOG CONVERTER

(75) Inventors: Steven R. Norsworthy, Cardiff, CA (US); Andrew Tham, San Diego, CA (US); Jason Rupert Redgrave, Mountain View, CA (US); Aubrey Arthur Grey, Thousand Oaks, CA (US)

(73) Assignee: STMicroelectronics N.V. (NL)

( * ) Notice: Subject to any disclaimer, the term of this patent is extended or adjusted under 35 U.S.C. 154(b) by 0 days.

(21) Appl. No.: 11/452,183

(22) Filed: Jun. 13, 2006
(Under 37 CFR 1.47)

(65) Prior Publication Data
US 2006/0244648 A1 Nov. 2, 2006

Related U.S. Application Data

(62) Division of application No. 10/910,917, filed on Aug. 3, 2004, now Pat. No. 7,116,253.

(60) Provisional application No. 60/493,052, filed on Aug. 5, 2003.

(51) Int. Cl.
*H03M 1/66* (2006.01)
(52) U.S. Cl. ............... 341/144; 341/136; 341/135; 341/132
(58) Field of Classification Search ......... 341/144, 341/127, 132, 135, 136
See application file for complete search history.

(56) References Cited

U.S. PATENT DOCUMENTS

| | | | |
|---|---|---|---|
| 4,510,486 A | 4/1985 | Nagano | |
| 4,607,249 A | 8/1986 | Naylor | |
| 5,245,254 A | 9/1993 | Lee | |
| 5,463,394 A | 10/1995 | Sun | |
| 5,483,150 A | 1/1996 | Elliott et al. | |
| 5,508,702 A | 4/1996 | Estrada et al. | |
| 5,625,360 A | 4/1997 | Garrity et al. | |
| 5,789,974 A * | 8/1998 | Ferguson et al. | 330/2 |
| 5,838,192 A * | 11/1998 | Bowers et al. | 327/541 |
| 5,914,621 A * | 6/1999 | Coy | 327/134 |
| 6,337,647 B1 | 1/2002 | Masson et al. | |
| 6,459,396 B2 | 10/2002 | Mori | |

* cited by examiner

*Primary Examiner*—Jean B Jeanglaude
(74) *Attorney, Agent, or Firm*—Lisa K. Jorgenson; William A. Munck

(57) ABSTRACT

A radio frequency digital-to-analog converter with a programmable current output. In exemplary aspects of the invention, improved apparatus and methods for providing (i) current mirror matching, (ii) enhanced current pulse rising edge performance, (ii) reduced base voltage swing, and (iv) compensated high voltage swing, are provided. The foregoing apparatus and methods can be applied to any RF signal application (wireless or otherwise), including for example wireless cellular handsets.

20 Claims, 10 Drawing Sheets

IT(qD0) = OUTPUT CURRENT BASE TO GROUND, IT(qD) = BASE TO gndG

VOLTAGE AT COLLECTOR OF HV DEVICE qC/B,C UNCOMPENSATED, IS(VA, VB, VC) COMPENSATED

RADIO FREQUENCY DIGITAL-TO-ANALOG CONVERTER

CROSS-REFERENCE TO RELATED APPLICATIONS

This application is a divisional patent application of, and claims priority to, commonly-assigned prior U.S. patent application Ser. No. 10/910,917, filed on Aug. 3, 2004 and issued as U.S. Pat. No. 7,116,253 on Oct. 3, 2006, entitled "RADIO FREQUENCY DIGITAL-TO-ANALOG CONVERTER", and further claims the benefit through that application to U.S. Provisional Patent Application No. 60/493,052 filed on Aug. 5, 2003 which is hereby incorporated by reference into the present disclosure as if fully set forth herein.

This application is related to co-owned and co-pending U.S. patent application Ser. No. 10/382,297 filed Mar. 4, 2003 and entitled "RESONANT POWER CONVERTER FOR RADIO FREQUENCY TRANSMISSION AND METHOD", published on Feb. 26, 2004 as U.S. Patent Application Publication No. 20040037363, which claims priority benefit of U.S. Provisional Patent Application Ser. No. 60/361,812 of the same title filed Mar. 4, 2002, and to co-owned and co-pending U.S. patent application Ser. No. 10/382,326 filed Mar. 4, 2003 and entitled "CODER APPARATUS FOR RESONANT POWER CONVERSION AND METHOD" published on Nov. 20, 2003 as U.S. Patent Publication No. 20030216906, which claims priority benefit of U.S. Provisional Patent Application Ser. No. 60/361,813 of the same title filed Mar. 4, 2002, each of which are incorporated by reference herein in their entirety. This application is also related to co-owned U.S. patent application Ser. No. 10/910,941 filed Aug. 3, 2004 and entitled "VARIABLE CODER APPARATUS FOR RESONANT POWER CONVERSION AND METHOD," published on Jul. 28, 2005 as U.S. Patent Application Publication No. 2005/0163232, which claims priority to U.S. Provisional Patent Application Ser. No. 60/493,053 of the same title filed Aug. 5, 2003, and to U.S. patent application Ser. No. 10/910,910 entitled "NOISE SHAPED INTERPOLATOR AND DECIMATOR APPARATUS AND METHOD," published on Sep. 22, 2005 as U.S. Patent Application Publication No. 2005/0207480, which claims priority to U.S. Provisional Patent Application Ser. No. 60/493,041 filed Aug. 5, 2003, both of the foregoing incorporated by reference herein in their entirety.

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

The present invention relates generally radio frequency signals, and specifically for efficient apparatus and methods for radio frequency (RF) signal transmission, reception, and modulation.

DESCRIPTION OF RELATED TECHNOLOGY

Radio frequency D/A converters (RDAC) are used in many types of RF systems, including those used for wireless/cellular communication or data transmission. These devices are used, inter alia, to convert digital communications data to an analog signal for transmission over an air interface.

For example, consider an exemplary PCS system which operates in the 1850-1990 MHz band. Many of these systems use radio frequencies of about 1910 MHz, which produces a period of 523 picoseconds (ps). An RDAC used to generate an analog output in such a system must be able to (i) accept high-speed digital control signals as inputs, and (ii) produce, within one period, a plurality (e.g., four (4)) current output pulses. For example, in the aforementioned PCS application (CDMA) using the 1910 MHz band, the RDAC must operate at about 130 ps/pulse. In exemplary configurations, these pulses are made programmable (e.g., from 10 mA to 1 A, with about 40 dB dynamic range). The area of the pulse ideally is the same for each pulse in the sequence, and is independent of the history of the pulse sequence. To increase signal efficiency, the output voltage swing should be as large as possible ($>6V_{pp}$).

Prior art solutions to the foregoing have been unnecessarily complex, and/or lacked adequate performance in many respects (including use of excessive amounts of power). This latter disability is especially problematic for hand-held or mobile wireless devices, wherein battery capacity and operation longevity (without recharge) are at a premium. As discussed in detail subsequently herein with respect to FIGS. 1-2, 4a, 6a, 8a and 8b, 9, and 10a and 10b, many of the disabilities of the prior art stem from transistor switching architectures that (i) consume inordinate amounts of power due to inefficiencies inherent in their design (such as excessive bias voltage swings and the presence of undesired capacitive currents); (ii) have non-linear or unpredictable output current profiles as a function of output voltage; and (iii) poor pulse shaping including insufficiently fast rise and/or fall times for pulses.

Hence, what is needed is an improved DAC architecture and associated techniques which provide a high degree of responsiveness and accuracy (so as to be suitable in very demanding applications with short pulse intervals), yet which also provides a high degree of power efficiency. Such improved DAC would also ideally be able to be adapted to or rendered within existing semiconductor process technologies (as well as using discrete components if desired).

SUMMARY OF THE INVENTION

The present invention satisfies the aforementioned needs by providing an improved apparatus and methods for digital-to-analog conversion.

In a first aspect of the invention, an improved radio frequency digital-to-analog converter (DAC) is disclosed. In one exemplary embodiment, the DAC is adapted to provide enhanced rising edge performance for current pulses, and comprises: at least one output transistor; and at least one capacitor electrically disposed between a high speed control signal node of said circuit and the base of said at least one output transistor; wherein said at least one capacitor results in a rapid rising edge of said current pulses upon the application of a signal to said control signal node. A first switch adapted to switch the base of said at least one output transistor to alternate ones of a plurality of voltages; and a second switch electrically coupled to said first switch and adapted to correct for a voltage drop associated with said first switch, are also optionally provided. The first and second switches and said at least one capacitor are scaled to as small a value as possible, while still providing said rapid rising edge.

In another embodiment, the DAC comprises: an output transistor; a first switch adapted to switch the base of said output transistor to alternate ones of a plurality of voltages; and a second switch electrically coupled to said first switch and adapted to correct for a voltage drop associated with said first switch. A reference bias transistor electrically coupled to said second switch is further provided. The voltage drop, left uncorrected, would produce a mismatch of a current mirror from said reference bias transistor to said output transistor.

The second switch, which has a substantially lower switching power than said first switch, is used to correct this mismatch.

Yet another embodiment of the DAC apparatus comprises an output transistor device having a base node, said apparatus being adapted to reduce the voltage swing associated with said base node during switching, said apparatus comprising; a first switch adapted to switch the base of said output transistor device to alternate ones of first and second voltages; and a second transistor device adapted to generate the second ("rail") voltage. A third transistor device electrically communicates with said first switch, and generates a bias reference voltage. The two voltages (bias reference and rail) The conversion apparatus of Claim C, further comprising a second switch electrically coupled to said first switch and adapted to correct for a voltage drop associated with said first switch.

Still another embodiment of the DAC apparatus comprises: a first transistor device having a base node; a second transistor device disposed in series with said first device; and apparatus adapted to determine the base node current of said first device; wherein current of substantially the same magnitude as said base node current is injected into at least a portion of said first device in order to compensate for at least a portion of said base node current of said first device. In one variant, first device comprises a high voltage transistor device, and said second device comprises a high speed transistor device disposed in cascade configuration with the first device, and the current is injected into the collector of said first device. In a second variant, the current is injected into the emitter of said first device. In a third variant, the current is injected into the base.

In still another embodiment, the digital-to-analog conversion apparatus comprises: a first sub-circuit having a high voltage device producing a substantially sinusoidal voltage profile at an output node thereof, a second sub-circuit operatively coupled to said first sub-circuit and comprising a second high voltage device, said second device generating a current comprising first and second current components, said second component comprising a capacitive current related at least in part to said output node voltage profile; and a transistor device used to sense only said second component and substantially subtract said second current component from said current generated by said second device.

In a second aspect of the invention, an improved method for reducing base voltage swing in a DAC or similar circuit is disclosed. The method generally comprises providing a circuit device (e.g., transistor) having the same size as an output transistor, using the circuit device to generate a bias rail voltage, and switching a base node of the output device to the bias rail voltage. This reduces the magnitude of the voltage swing, and inefficiencies associated therewith.

In a third aspect of the invention, an improved method of compensating for high voltage swing is disclosed. The method generally comprises providing a first circuit having a high output voltage device; providing a second circuit adapted for sensing a base current; providing a third circuit comprising: (i) a first device adapted to monitor said first circuit's output voltage, the first device further adapted to generate a first current; and (ii) a second device adapted to sense a second current due to a voltage swing; subtracting the second current from the first current to obtain current representative of only the first, and using the first current to compensate the high output voltage device.

In a fourth aspect of the invention, an improved radio frequency (RF) transmitter device is disclosed. In one embodiment, the device comprises: a baseband processor; a resonator operatively coupled to the baseband processor, and a high-efficiency DAC such as that described above. The resonator and DAC cooperate to convert the digital in-phase (I) and quadrature (Q) signals obtained from the baseband processor directly to an analog representation at carrier frequency for transmission over an antenna in a highly power-efficient manner. In one variant, the resonator is further adapted to dislocate quantization noise generated by the transmitter outside of one or more receive bands associated with a related receiver unit of the transmitter.

In another embodiment, the transmitter comprises a traditional carrier-based architecture having a baseband processor, DAC, power amplifier, up-conversion apparatus (from baseband to an intermediate frequency and then to carrier), and antenna. The DAC operates to receive digital I and Q signals from the baseband processor, and convert these signals to the analog domain for subsequent up-conversion, power amplification, and transmission over the antenna.

BRIEF DESCRIPTION OF THE DRAWINGS

The features, objectives, and advantages of the invention will become more apparent from the detailed description set forth below when taken in conjunction with the drawings, wherein.

DETAILED DESCRIPTION OF THE INVENTION

Figure 1:
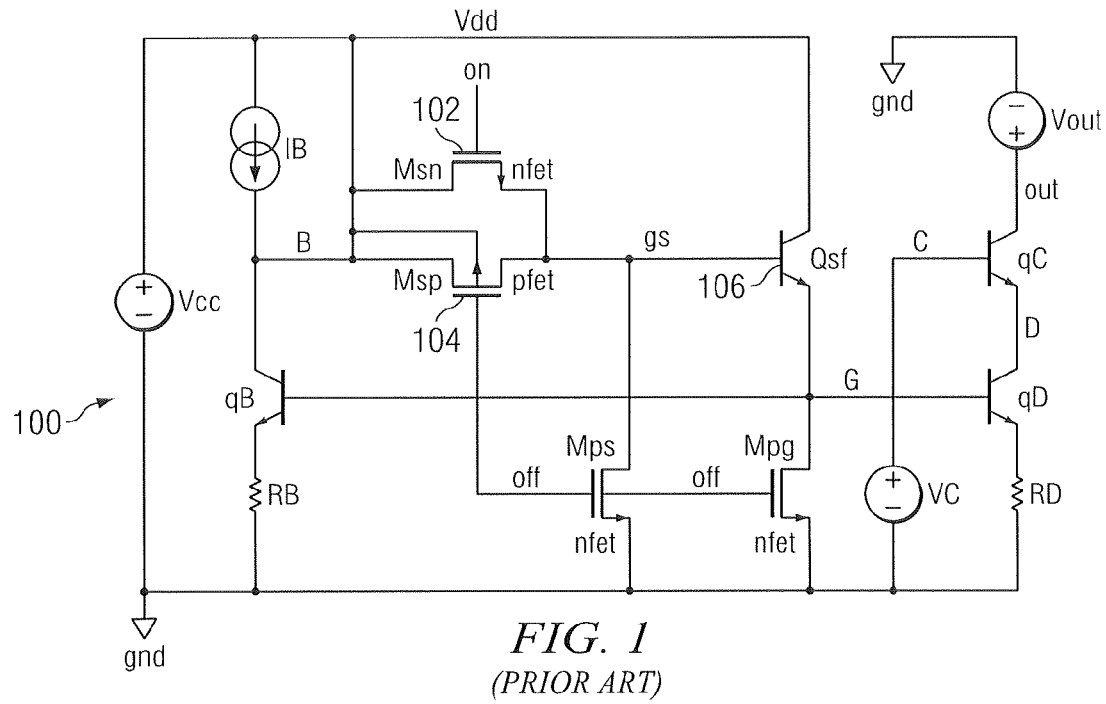
FIG. 1 is a schematic (circuit) diagram of a typical prior art circuit which generates one unit (10 mA) of current pulse.

Reference is now made to the drawings wherein like numerals refer to like parts throughout.

As used herein, the term "wireless" refers to any radio frequency interface used to transmit data or other information including, without limitation, those utilizing direct sequence spread spectrum (DSSS) (e.g., code division multiple access or CDMA), frequency hopping spread spectrum (FHSS), frequency division multiple access (FDMA), time division multiple access (TDMA), or orthogonal frequency division multiplexing (OFDM), or any variations, combinations, or embodiments thereof, such as for example, WCDMA, CDMA-2000, 3GPP, 3GPP2, PCS, IEEE-Std. 802.11x, or GSM.

As used herein, the term "code division multiple access," or CDMA, generally refers to digital wireless technology that uses a spread spectrum technique to disperse a signal across a wide range of frequencies, such as according to a pseudo-noise or other code.

As used herein, the term "NPN device" or "NPN-transistor" generally refer to an NPN bipolar transistor. An NPN device or transistor may be used in a circuit as a current sink As used herein, the term "positive-channel metal-oxide semiconductor," or PMOS, generally refers to a type of p-channel field effect transistor (FET) or type of circuit utilizing same.

As used herein, the term "MOS" is used generally to refer to any member of the metal oxide semiconductor or similar families, including for example PMOS, NMOS, or even CMOS. The term "negative-channel metal-oxide semiconductor," or NMOS, generally refers to a type of n-channel FET or type of circuit utilizing same As used herein, the term "emitter follower," or EF, generally refers to a circuit configuration with a very low output resistance and a high input resistance in which the circuit output is coupled to the emitter terminal of a bipolar transistor.

As used herein, the term "avalanche multiplication" generally refers to current multiplication in a semiconductor device due to the initiation of a chain event where the electrical field is strong enough for individual free charges to achieve sufficient energy to knock other bound charges in a lattice free, thereby contributing to the total current subject to the electrical field.

As used herein, the term "current mirror" generally refers to a type of circuit having at least two circuit branches, wherein the current in one branch is proportional to (e.g. mirrors) current in the other branch. In the context of a differential amplifier having two NPN bipolar transistors, a current mirror having two PNP bipolar transistors may be used as a load device therefor.

As used herein, the term "processor" is meant generally to include all types of data or signal processing devices including, without limitation, digital signal processors (DSPs), reduced instruction set computers (RISC), general-purpose (CISC) processors, microprocessors, gate arrays (e.g., FPGAs), Reconfigurable Compute Fabrics (RCFs), and application-specific integrated circuits (ASICs). Such digital processors may be contained on a single unitary IC die, or distributed across multiple components.

As used herein, the term "integrated circuit (IC)" refers to any type of device having any level of integration (including without limitation ULSI, VLSI, and LSI) and irrespective of process or base materials (including, without limitation Si, SiGe, CMOS and GAs). ICs may include, for example, memory devices (e.g., DRAM, SRAM, DDRAM, EEPROM/Flash, ROM), digital processors, SoC devices, FPGAs, ASICs, ADCs, DACs, transceivers, and other devices, as well as any combinations thereof.

Overview—

The present invention discloses, inter alia, improved apparatus and methods for radio frequency D/A conversion. The present invention provides a set of complementary solutions adapted to overcome the deficiencies of the prior art, including improving DAC response and notably power-efficiency, thereby making the invention particularly well adapted for wireless applications (such as for example a transmitter in a cellular handset) where electrical power is at a premium.

For example, one embodiment of the invention utilizes a scaled-down "dummy" transistor switch in conjunction with another switch used to control switching of the base of an output transistor. The presence of the dummy switch, inter alia, corrects for DC voltage drop created by the other (main) switch, thereby allowing for accurate current mirroring of the output current from the transistor.

In another aspect, a capacitor is used within the switching signal path of the circuit, thereby allowing for enhanced (i.e., more rapid) response of the output current from the transistor and hence "sharper" pulses.

Other features of the invention include circuit configurations adapted to reduce the "on/off" bias voltage swing experienced in switching the output transistor(s) (thereby reducing the "wasted" power dissipated into the circuit), as well as means useful in compensating for large voltage swings due to, e.g., avalanche multiplication in the collector of the high-voltage transistor devices, and capacitive currents present in the circuit.

Advantageously, the present invention is readily adapted to any number of different RF circuit configurations, whether wireless or wireline in nature. For example, it is particularly useful with the "direct conversion" apparatus described in U.S. patent application Ser. No. 10/382,297 filed Mar. 4, 2003 and entitled "RESONANT POWER CONVERTER FOR RADIO FREQUENCY TRANSMISSION AND METHOD", and application Ser. No. 10/382,326 filed Mar. 4, 2003 and entitled "CODER APPARATUS FOR RESONANT POWER CONVERSION AND METHOD", both previously incorporated herein, although it may be applied with equal success to other paradigms.

Hence, it will be recognized that while described in the context of the foregoing exemplary wireless communications system, the present invention is not so limited, and may be utilized within a variety of different applications readily apparent to those of ordinary skill in the art provided the present disclosure, including both wireless and wireline systems. The following embodiments are therefore merely illustrative of the broader principles of the invention.

Improved Matching Circuit

Referring now to FIGS. 1-4b, a first embodiment of the RDAC of the invention is described.

FIG. 1 is a schematic diagram of one exemplary prior art circuit 100 that generates one unit (e.g., 10 mA) of the current pulse. Because the NPN devices are biased near their peak cutoff frequency ($F_t$), the base emitter voltage ($V_{be}$) of the transistors are approximately 1V (volt). Therefore, the base of the emitter follower transistor $Q_{sf}$ 106 is approximately 2V. If NMOS 102 and PMOS 104 switches are used to switch the base of the emitter follower transistor $Q_{sf}$ between "on" and "off" states, the voltage swing for the gates of the NMOS and PMOS switches 102 and 104 are very large (approximately 2.7V). The large voltage swing dissipates more power than desired. State-of-the-art MOS high-speed transistors have relatively thin gate oxides and can only operate with power supplies supplying reduced supply voltages, such as 1.8V. Therefore, such transistor devices cannot be used. Consequently, a thick gate oxide device (3.3V device) can be used, although such a device is significantly slower.

Therefore, an improved method of matching to control the output current pulse and circuit power is needed. A large switch provides the required reduction in the DC drop; however, a large transient power is also required.

The present invention solves the foregoing problems by, inter alia, utilizing a dummy MOS transistor Switch (MSW). The dummy switch in the exemplary embodiments is chosen to be comparatively small (including having a low switching power) since multiple of such switches may be used in the output stage of a given device.

Figure 2:
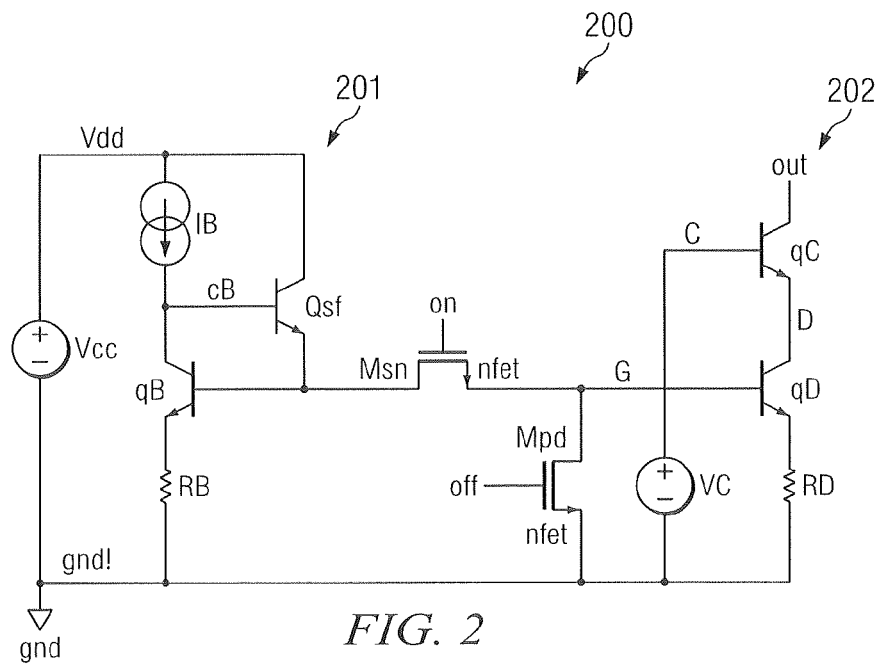
FIG. 2 is a circuit diagram of a first exemplary embodiment of the RDAC of the present invention (without a dummy MSW).

FIG. 2 is a diagram of an exemplary DAC circuit 200 which functions as a controlled current source. Circuit 200 may itself form a single bit DAC and receive at its input(s) a single bit of digital information and output a current level corresponding to the value of the binary bit input. Alternatively, a plurality of circuits 200 may be utilized in a multi-bit DAC to convert a multi-bit digital signal into an analog signal. The use of controlled current sources in multi-bit DACs is known in the art and will not be described in detail for reasons of simplicity.

Referring to FIG. 2, circuit 200 is adapted to switch the base of the output transistor qD to either a reference bias voltage, set by the reference branch circuit 201 including transistors Qsf and qB, or to ground. In this circuit 200, a low voltage (e.g., 1.7V) is adequate to switch the transistor MSN (MSW) between on and off states. Circuit 200 further includes a load branch circuit 202, including transistor qD. The base of the emitter follower transistor $Q_{sf}$ is still at approximately 2V, yet it is not switched, but rather just a dc bias voltage. Because the reference branch circuit 201 is shared with a plurality of other load branch circuits 202 within the output section of the present DAC (e.g., approximately 100 other output sections in the exemplary embodiment), the current and power dissipation in the reference branch circuit 201 is insignificant. When transistor MSN (MSW) is activated or turned on and transistor Mpd is turned off, reference branch circuit 201 and the load branch circuit(s) 202 form a current mirror, in which the reference current that flows through transistor qD in the load branch circuit 202 is proportional to (or mirrors) the current in reference branch circuit 201. Alternatively, when transistor MSN is turned off and transistor Mpd is turned on, transistor qD is turned off and no current flows in load branch 202

However, the drain-to-source resistance of transistor MSN (MSW) in circuit 200 causes a nonzero DC voltage drop across MSW, which results in a mismatch of the current between the reference branch circuit 201 and load branch circuit 202. One embodiment of the present invention solves this problem by using 0.5 mA in the reference branch circuit 202, which is multiplied by 20 to produce 10 mA of current in each load branch circuit 202 (0.5 mA×20=10 mA). It is understood that other current levels and current scale factors may be utilized in circuit 200.

Figure 3:
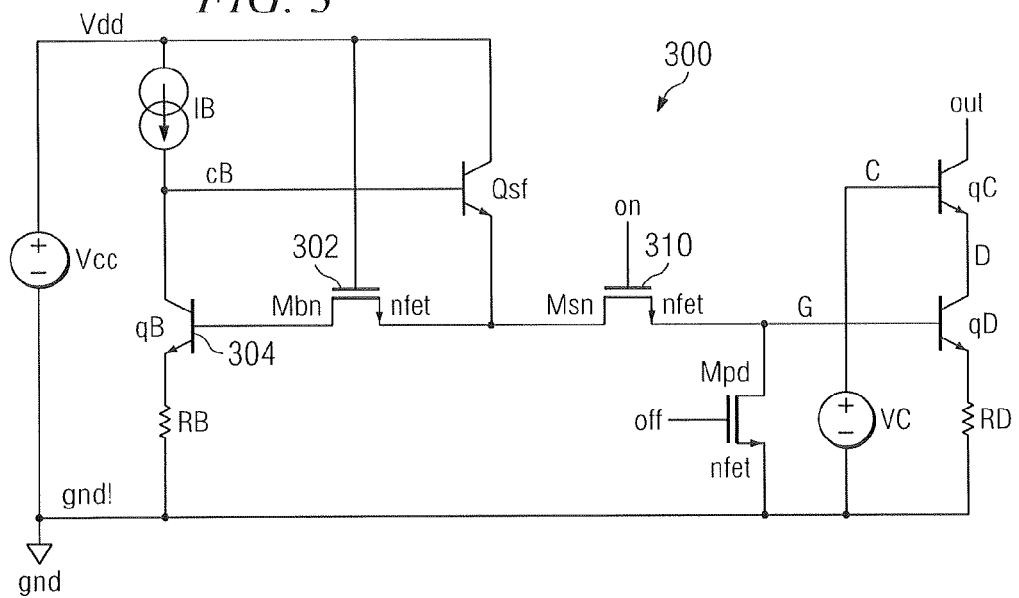
FIG. 3 is a circuit diagram of a second exemplary embodiment of the RDAC of the present invention with a dummy MSW.

FIG. 3 is a circuit diagram of one embodiment of the present invention. In this circuit embodiment 300, a "dummy" switch 302 is placed between the base terminal of transistor 304 (qB) and MSW 310. This dummy switch device 302 is selected so as to comprise a fraction (e.g., $\frac{1}{20}^{th}$) of the width (current) of the main switch device MSN 310. Dummy switch 302 corrects for the DC voltage drop created by transistor 310 so as to allow for the current in load branch circuit 202 relatively closely follows (mirrors) the current in reference branch circuit 201.

Figure 4A:
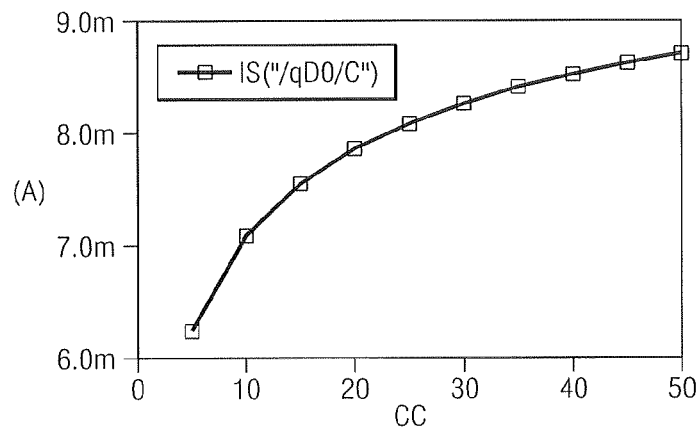
FIG. 4a is a graph of current for an uncompensated circuit.
Figure 4B:
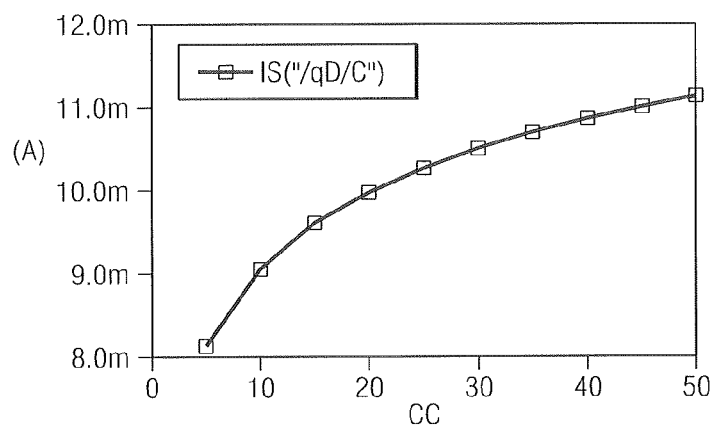
FIG. 4b is a graph of current for a compensated circuit (with a dummy MOS switch).

FIGS. 4a and 4b are graphs that illustrate exemplary SPICE simulation results for circuits with and without a dummy switch, respectively. CC is a variable used to scale the device size of the MOS switch 310, although it will be recognized that other variables may be used. Note that in FIG. 4a, the output current does not reach the ideal/expected value (here, 10 mA) even with a very large CC value. As shown in FIG. 4b, however, the dummy switch compensates, and the output current is advantageously mirrored correctly to the expected value of 10 mA at a CC of 20. CC=20 is an optimum value in this example because it exactly corresponds to the ratio of the output current and the reference current.

Boosting Rising Edge of Current Pulses

In many RF circuit applications, a current pulse with a fast rising edge is desired from a controlled current source circuit(s) in an RDAC. For example, in one exemplary embodiment of the invention, the RDAC must produce multiple (e.g. 4) pulses within one "period" of about 523 ps (1 ps=1E-012s). Each current pulse must rise quickly in order to produce a pulse within 523/4≈130 ps. One method of achieving this sharp rising edge is to use an emitter follower to pull up the base node of the device qD. However, this method requires MOS switch(s) (e.g., NMOS and PMOS switches) disposed at the base node of the emitter follower, which in turn requires large voltage swings and dissipate significant amounts of power. In addition, due to the higher voltage requirement, a slower thick gate oxide MOS transistor would be needed.

Figure 5:
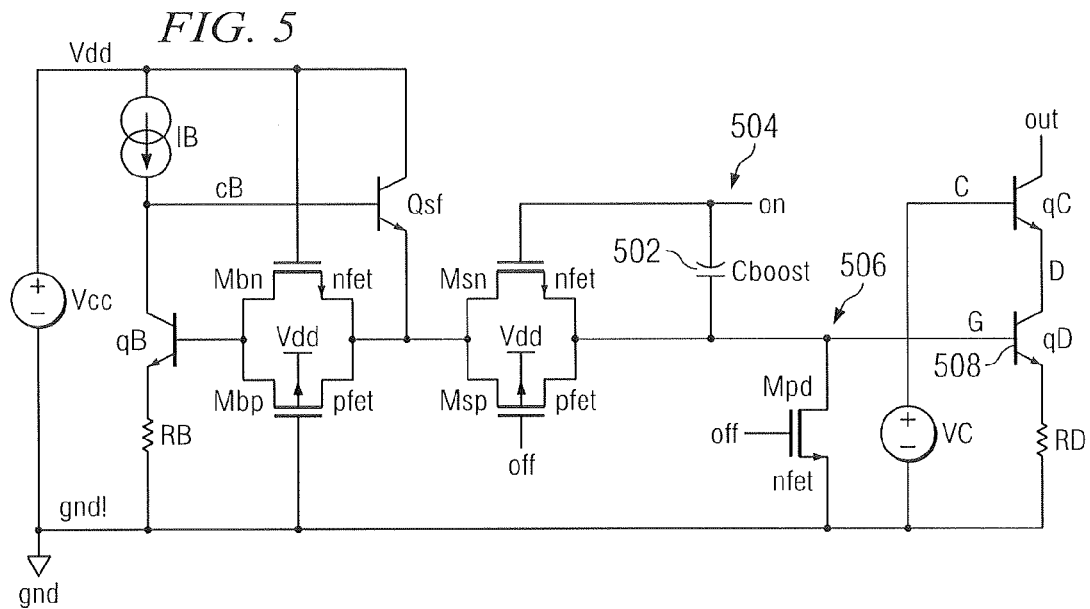
FIG. 5 is a circuit diagram of one exemplary embodiment of the RDAC of the present invention, having enhanced pulse rising edge performance.

The present invention advantageously overcomes the foregoing disabilities by providing a circuit with the desired rapid rise performance, yet which utilizes a minimum of power. FIG. 5 is a schematic of one such exemplary controlled current source for an RDAC according to the invention. A capacitor 502 ($C_{boost}$) is used to capacitively couple the high speed input control signal "on" 504 to the base node "G" 506 of the output transistor qD 508. Both the MOS transistor switches MSN, MSP and the $C_{boost}$ capacitor 502 are scaled to as small a value as possible, while still providing the desired boost in the rising edge of the current pulse. The actual switches are, in the illustrated embodiment, parallel combinations of NMOS and PMOS transistors, although other arrangements may conceivably be used. This configuration cancels the clock charge injection, as well as providing lower resistance and voltage drop across the switches.

Figure 6A:
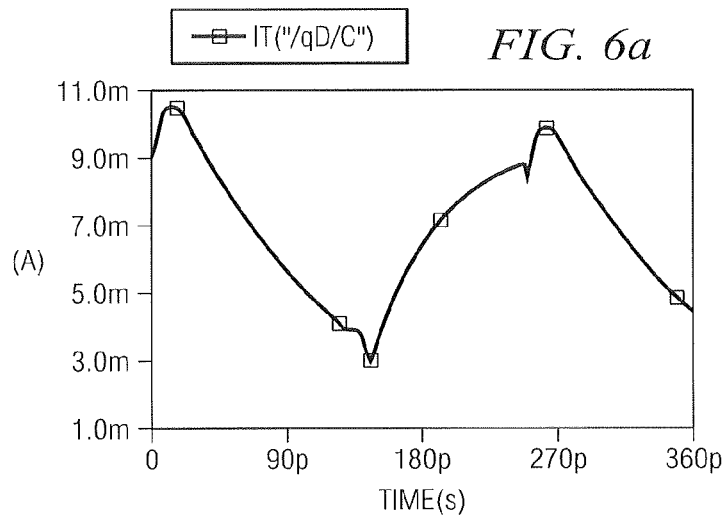
FIG. 6a is a graph of the output current of a prior art RDAC without the "boost" capacitor configuration of the present invention.
Figure 6B:
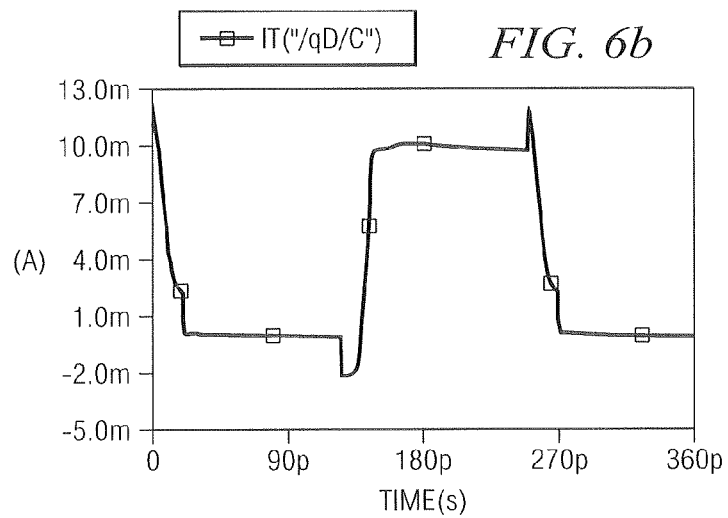
FIG. 6b is a graph of the output current of an improved RDAC according to the invention, having a "boost" capacitor.

FIG. 6a shows a graph of the output current of an exemplary circuit (simulated) without the $C_{boost}$ capacitor of FIG. 5. FIG. 6b shows a graph of the output current of the same circuit with the $C_{boost}$ capacitor 502. With the capacitor, the edges of the current pulse advantageously rise and fall much more quickly than without the capacitor, as shown in FIGS. 6b and 6a, respectively.

Reducing ON/OFF Base Voltage Swing

Normally, the base of the output transistor device qD (see prior discussion) is switched to ground, or to approximately the base voltage of the reference bias device qB, depending upon the state of the "on" and "off" input signals. This causes a fairly large base voltage swing for qD (typically on the order of 1V). Since the output device qD is comparatively large with large input capacitance, this larger base voltage swing is slower, and consumes more power than is optimal.

Figure 7:
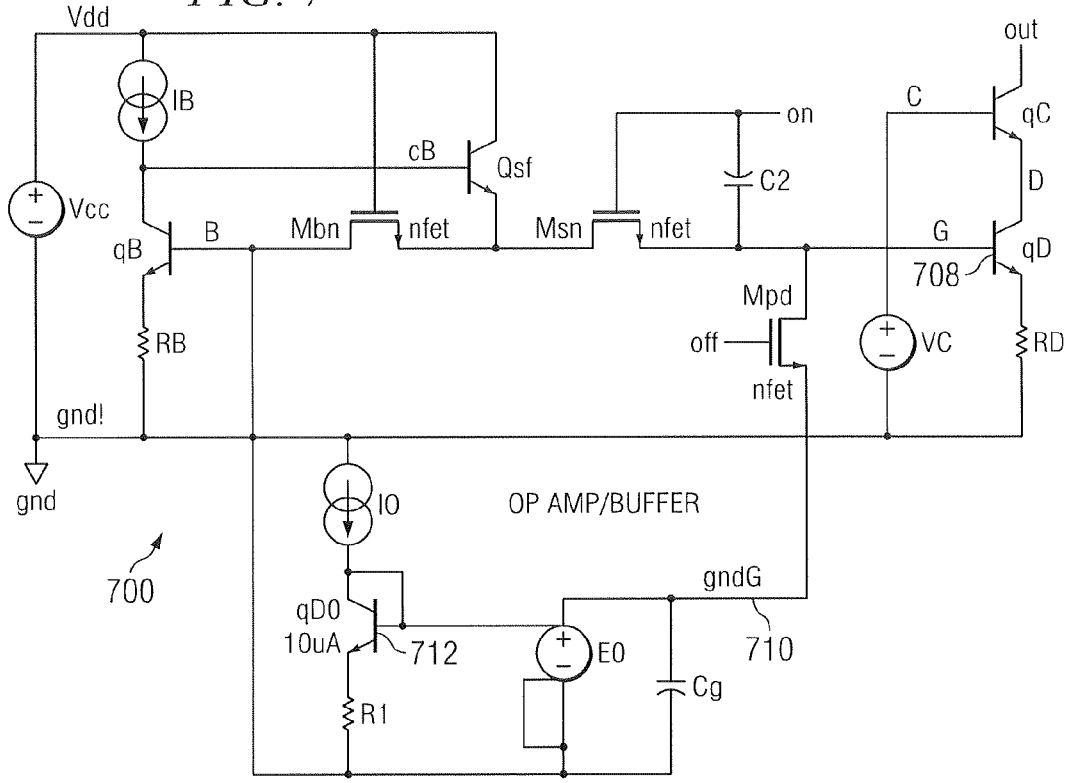
FIG. 7 is a circuit diagram of an exemplary RDAC according to the present invention, wherein the ON/OFF base voltage swing magnitude is reduced.

FIG. 7 is a circuit diagram of an exemplary embodiment of a controlled current source circuit 700 according to the invention, adapted to reduce the aforementioned base voltage swing of output transistor qD. Instead of switching the base node of the output transistor 708 (qD) to ground, the base node of transistor 708 (qD) of the circuit 700 of FIG. 7 is switched to a bias rail voltage of gndG 710 that is greater than the ground potential. This gndG voltage rail is generated by using a transistor 712 (qd0) of the same type and substantially the same size as the output transistor 708. It will be appreciated that while the present embodiment uses devices 712, 708 that are substantially identical in size, some degree of variation in sizing and/or configuration between the two devices can be tolerated, subject to the limitations described below. A very small current is used to bias the transistor 712 to a state wherein the transistor 712 is barely "ON" (e.g., 10 μA in the exemplary embodiment, wherein the normal "ON" state is on the order of 10 mA, three orders of magnitude higher). The base voltage of transistor 712 may be buffered. The ground rail "gndG" is used to pull the transistor 712 to the "OFF" state, thereby drastically reducing the voltage swing of the base node (G) of output transistor 708, and achieving significantly faster speeds with reduced power dissipation. When the control signal "OFF" is asserted and control signal "ON" is de-asserted, the base terminal of transistor qD (node G) is brought to the voltage provided by voltage source $E_0$.

Furthermore, since the device $qD_0$ 712 is the same size and configuration as the real output transistor qD 708, the base voltage bias rail that is set up to turn the device qD 708 to the aforementioned "barely ON" state will advantageously track process, temperature and power supply changes thereby avoiding differentials and unpredictable effects.

Figure 8A:
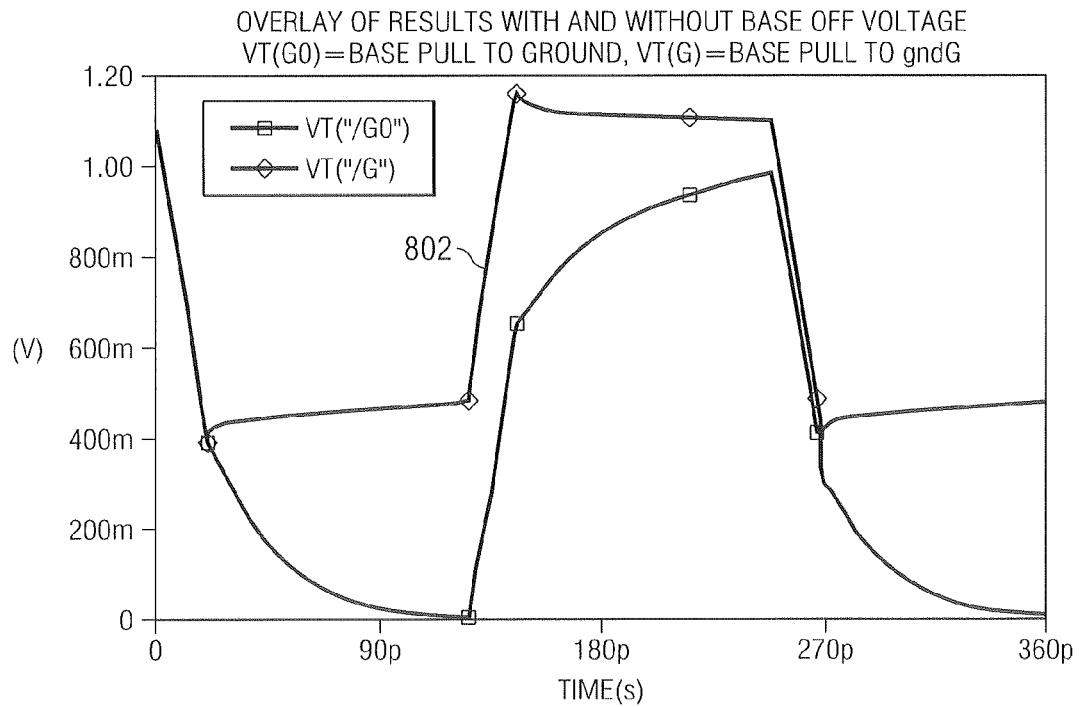
FIG. 8a is a graph of the base voltage of the output transistor qD of the circuit of FIG. 7, showing the voltage both with and without the bias rail of the present invention.
Figure 8B:
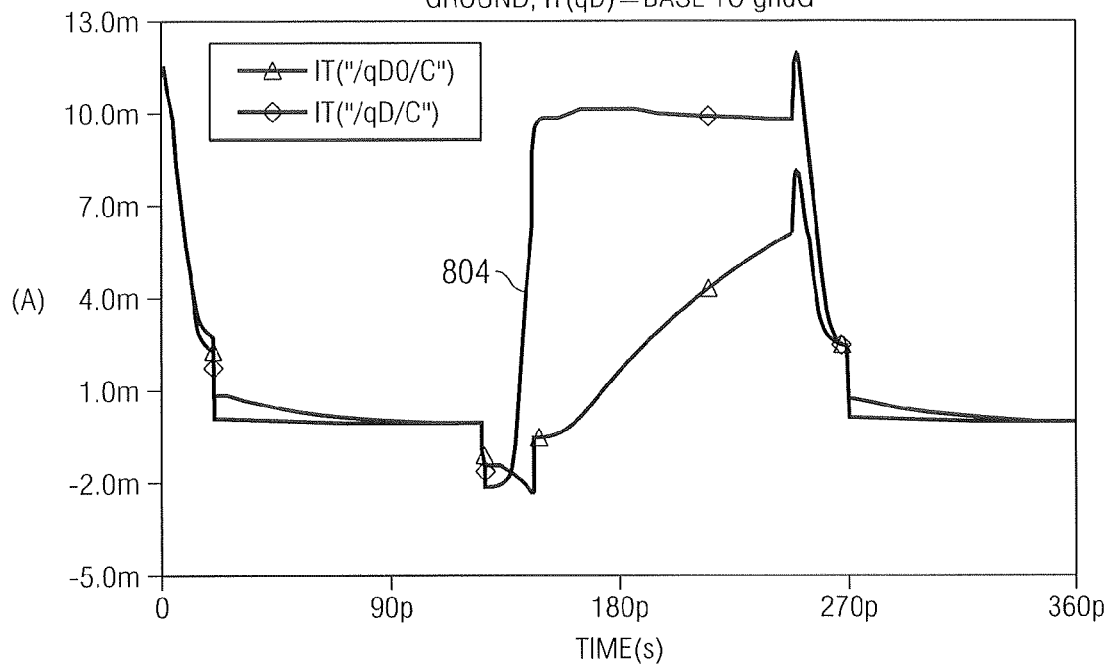
FIG. 8b is a graph of the output current of the output transistor qD of the circuit of FIG. 7, showing the current both with and without the bias rail.

FIG. 8a compares the base voltage of transistor 708 (node G) with and without its coupling to the bias rail gndG 710 of the configuration of FIG. 7. Note the improved response profile 802 of the base voltage as a function of time with the gndG 710 present. Similarly, FIG. 8b compares the base current of transistor 708 with the bias rail (see trace 804) and without the bias rail gndG 710. Hence, both FIGS. 8a and 8b show a marked improvement on the speed of the current pulse when the bias rail approach of FIG. 7 is used.

Compensating for High Voltage Swing

Figure 9:
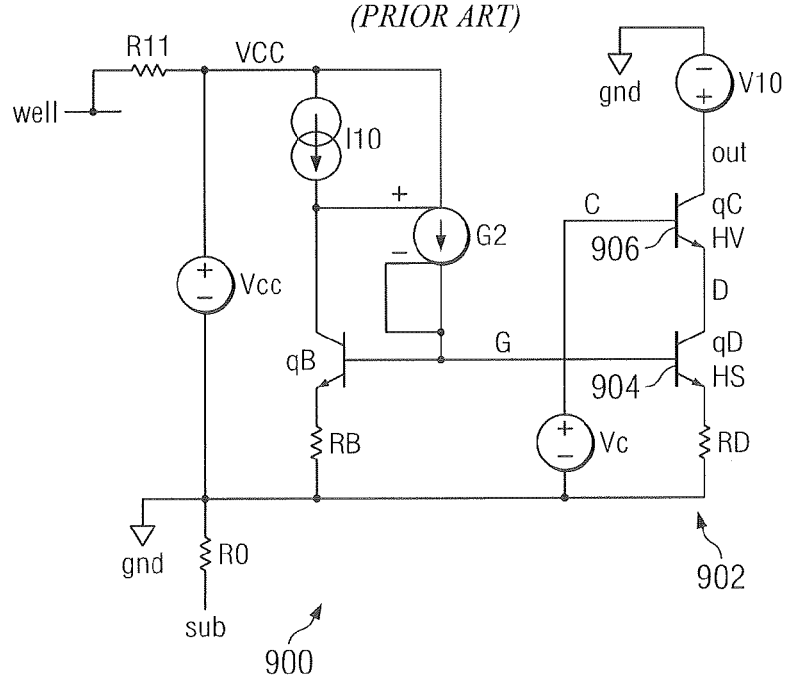
FIG. 9 is a circuit diagram of a prior art RDAC circuit having "cascade" configuration comprising high speed (HS) and high voltage (HV) transistor devices.
Figure 10A:
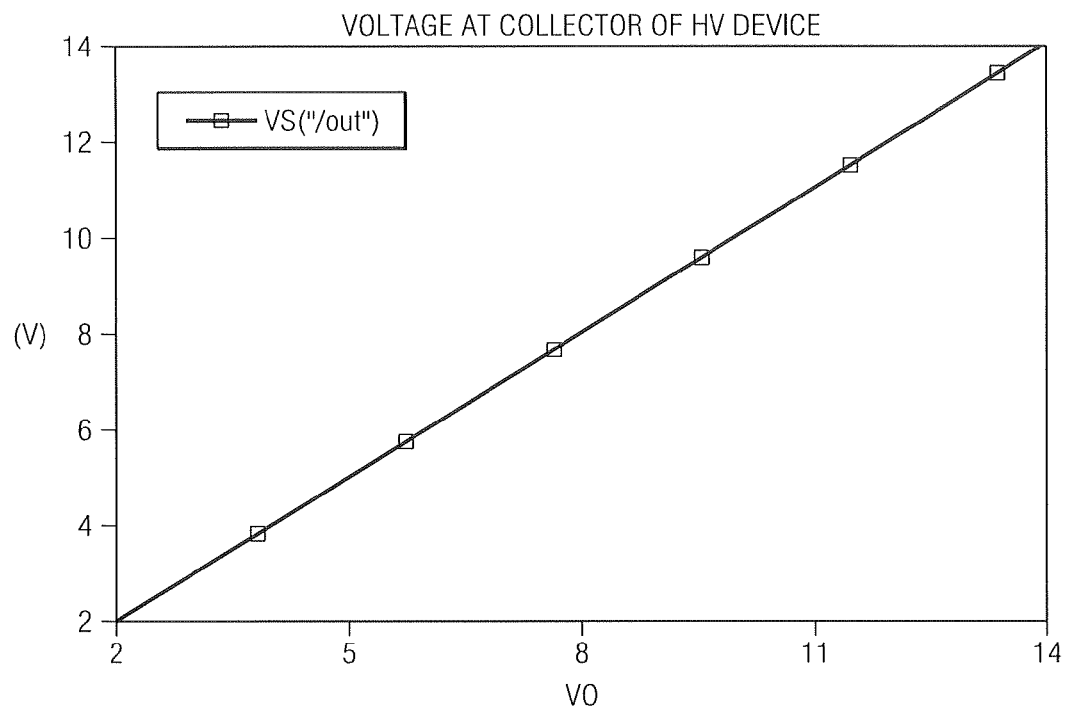
FIG. 10a is a graph of the voltage at the collector of the output device (HV) of the circuit of FIG. 9.
Figure 10B:
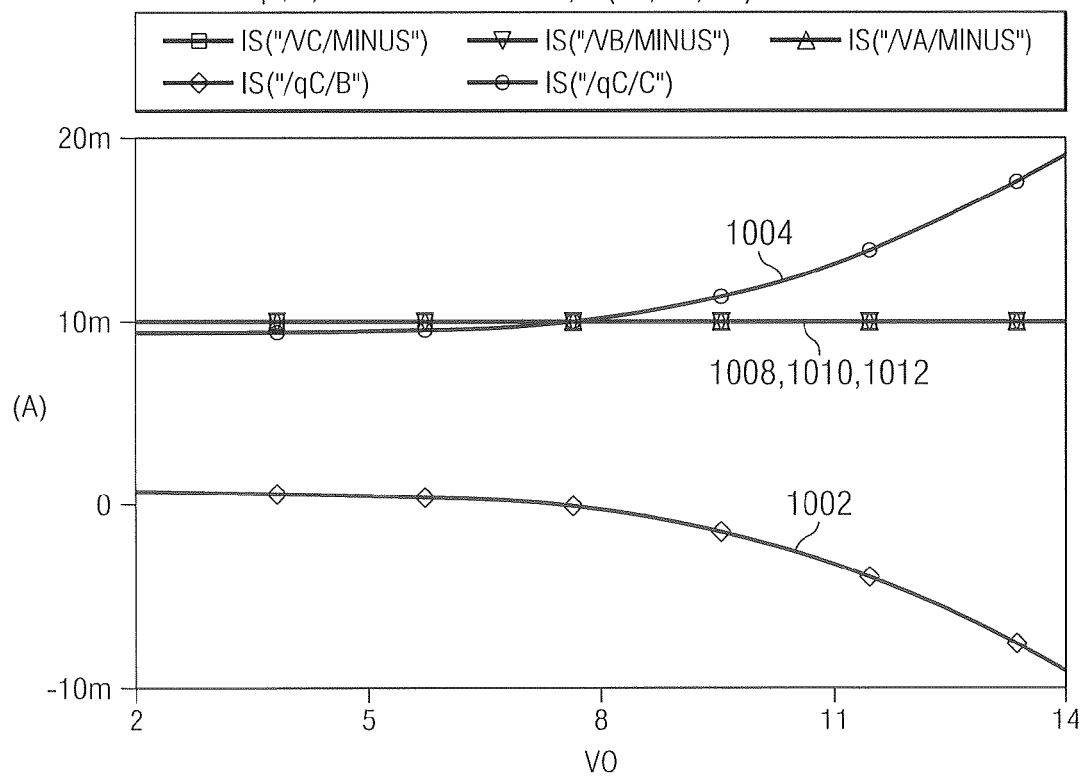
FIG. 10b is a graph of the uncompensated collector and base currents of the circuit of FIG. 9 (including effects of compensation of circuits of FIGS. 11a-11c).

FIG. 9 shows a circuit diagram of a typical prior art output circuit 900 (generally for similar uses as those of FIGS. 2, 3, 5 and 7 previously discussed herein). The output circuit stage 902 comprises a high speed (HS) transistor 904 and a high voltage (HV) transistor 906 coupled in a cascade configuration. Normally, to increase efficiency and speed, the output voltage swing of output circuit stage 902 is relatively very large (e.g., >6Vpp). This large voltage excursion induces collector-to-base avalanche multiplication, and causes the collector current of transistor 904 to be comparatively large. FIG. 10a shows a plot of the output voltage of output circuit stage 902 (node "out", voltage at the collector of the HV device 906). As shown in FIG. 10b, the collector current of a high voltage device 906 at a lower values of collector voltage (vo) is about 10 mA. When the output voltage is increased to 14V, the collector current increased to approximately 19 mA. This avalanche multiplication current flows out through the base node as shown in the plot IS(qC/B) 1002 in FIG. 10b.

Figure 11A:
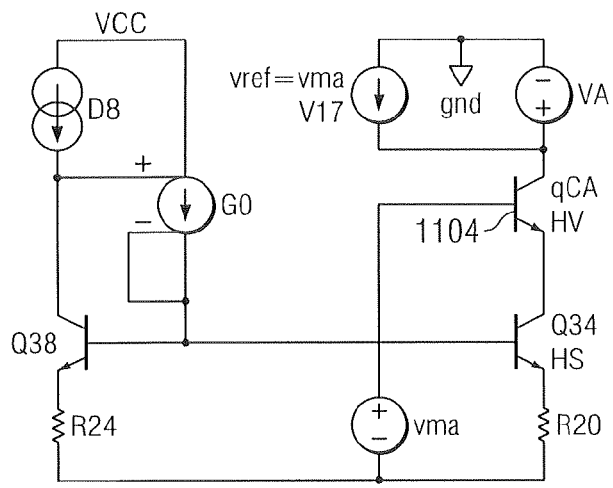
FIG. 11a is a circuit diagram of a first exemplary embodiment of the RDAC of the invention, adapted to compensate for avalanche multiplication current.
Figure 11B:
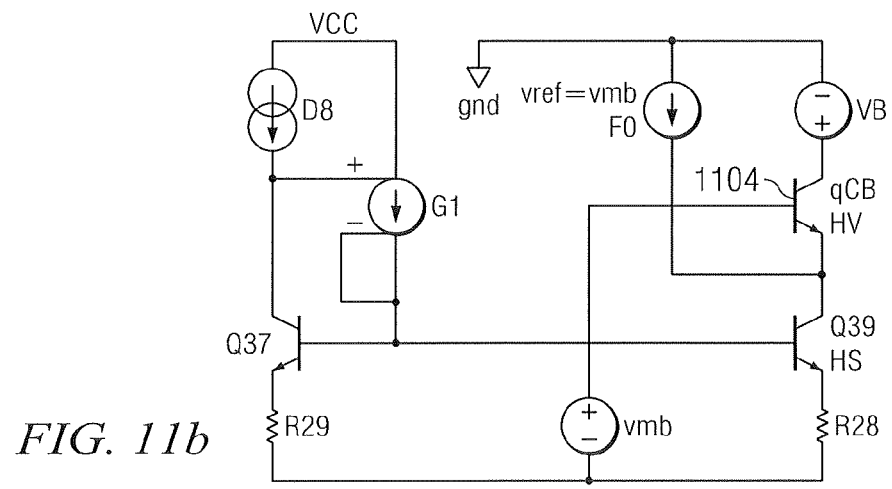
FIG. 11b is a circuit diagram of a second exemplary embodiment of the RDAC of the invention, adapted to compensate for avalanche multiplication current.
Figure 11C:
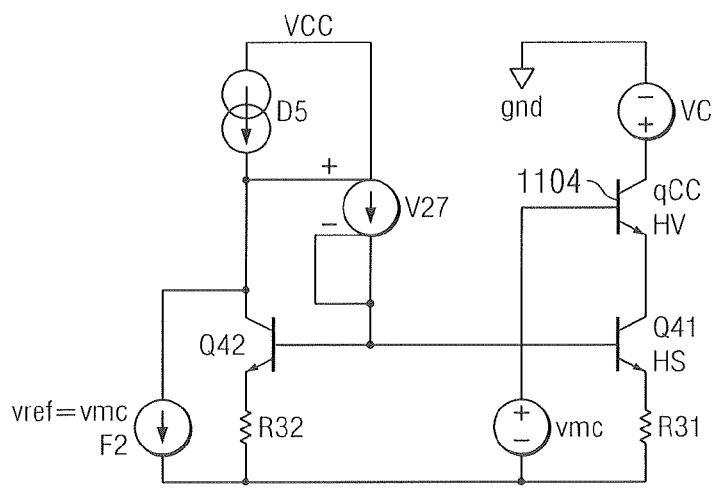
FIG. 11c is a circuit diagram of a second exemplary embodiment of the RDAC of the invention, adapted to compensate for avalanche multiplication current.

The present disclosure provides three (3) exemplary alternative circuit configurations adapted to compensate for the foregoing avalanche multiplication current; see FIGS. 11a, 11b, and 11c. The base current of HV in each circuit of FIGS. 11a, 11b, and 11c is sensed by a voltage source vma, vmb, and vmc, respectively. These base currents are then injected into the collector, emitter and reference bias, respectively, of the HV device 1104 (corresponding to the device 906 of the prior art configuration of FIG. 9.) to compensate for the avalanche multiplication current.

Referring again to FIGS. 10a and 10b, as the output voltage is increased from 2V to 14V, the uncompensated collector current IS(qC/C) 1004 increase from 10 mA to 19 mA (FIG. 10b). FIG. 10b also shows the uncompensated base current (qC/B) 1002 of HV increasing (in magnitude) from 0 mA to 9 mA. As shown in FIG. 10b, the compensated currents 1008, 1010, 1012 associated with each circuit of FIGS. 11a, 11b, and 11c advantageously remains very flat at 10 mA for an output voltage swing from 2V to 14V.

Figure 12:
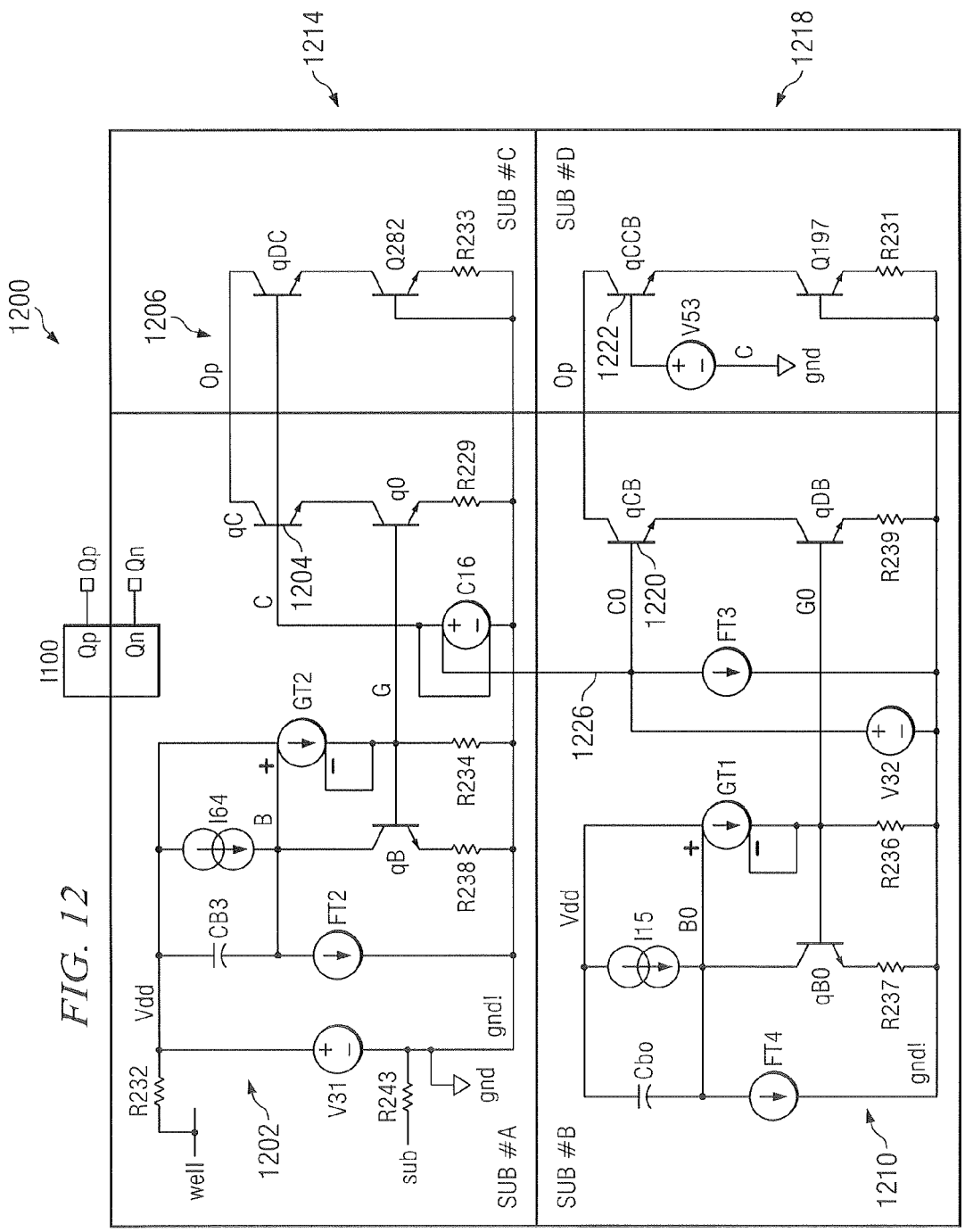
FIG. 12 is a circuit diagram of an exemplary alternate embodiment of the circuit in FIG. 11c.
Figure 13A:
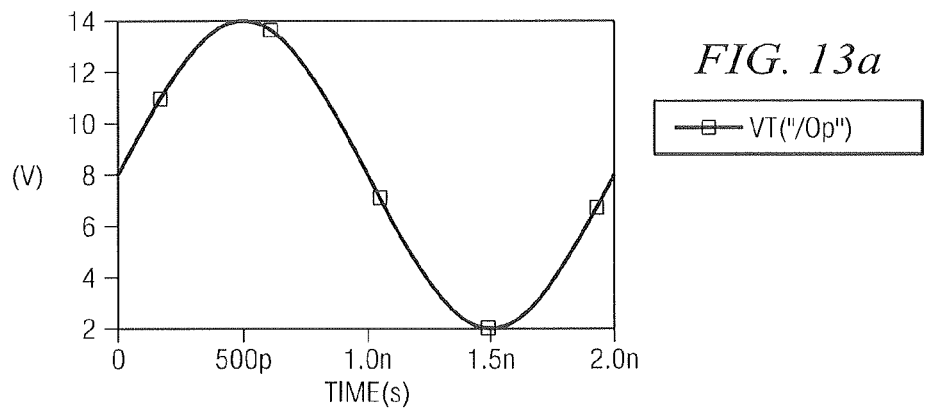
FIG. 13a is a graph of the output voltage of the circuit shown in FIG. 12.

Another exemplary variant of the compensated output circuit shown in FIG. 11c is shown in FIG. 12. In this circuit 1200, sub-circuit A (Sub#A) 1202 is the main output circuit, comparable to that of FIG. 11c. Note that the collector of the high voltage device 1204 is connected to output node $O_p$ 1206. Output node $O_p$ may have a sinusoidal voltage swing from approximately 2V to approximately 14V as shown in FIG. 13a. Sub-circuit (Sub#B) 1210 comprises a base current sensing circuit for sub-circuit A (Sub#A). The third sub-circuit (Sub#C) 1214 is optional; it is used to subtract and exclude the capacitive current component due to the sinusoidal output voltage swing of sub-circuit 1204. Sub-circuit (Sub#C) 1214 may also be used for simulation and testing. The fourth sub-circuit (Sub#D) 1218 is also optional, but may be used as an additional feature of the circuit. The transistor 1220 monitors the output voltage $O_p$ (Sub#D) to generate the avalanche multiplication current. The current generated by the transistor 1220 comprises a first component due to avalanche multiplication, and a second component due to the capacitive coupling. This second component is an undesirable capacitive current injected into the compensation circuit by the sinusoidal output voltage swing.

To address this problem, the illustrated circuit 1200 utilizes transistor 1222, which is used to sense only the capacitive current (second) component due to the sinusoidal output voltage swing. This capacitive current is subtracted from current generated by transistor 1220. Thus, the net result is only the avalanche multiplication current, which is then used by the first sub-circuit (Sub#A) 1202 via the connection 1226 between the circuits to compensate the relatively high output voltage of transistor 1204.

Figure 13B:
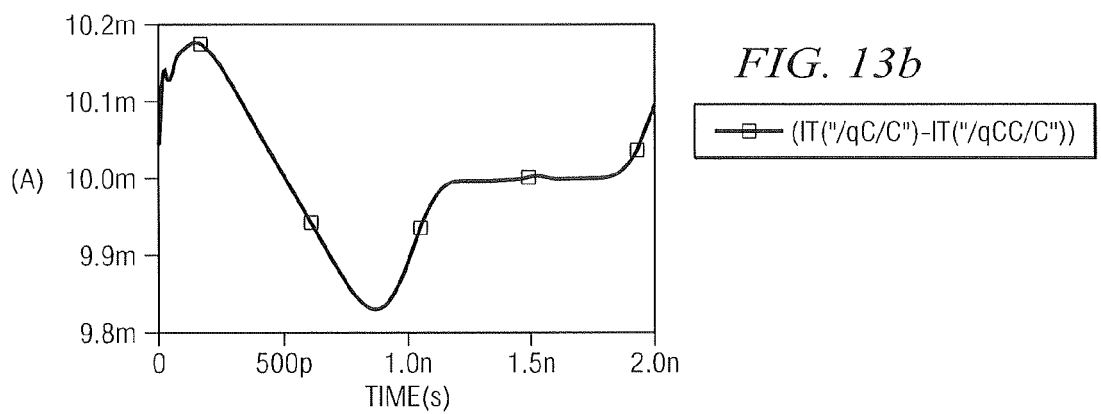
FIG. 13b is a graph of the compensated output current of the circuit shown in FIG. 12.

FIG. 13a shows the sinusoidal output voltage ($O_p$) swing from 2V to 14V (peak-to-peak). FIG. 13b shows the output current from the high voltage transistor 1204, which advantageously remains relatively constant near 10 mA.

RF System with RDAC

Figure 14A:
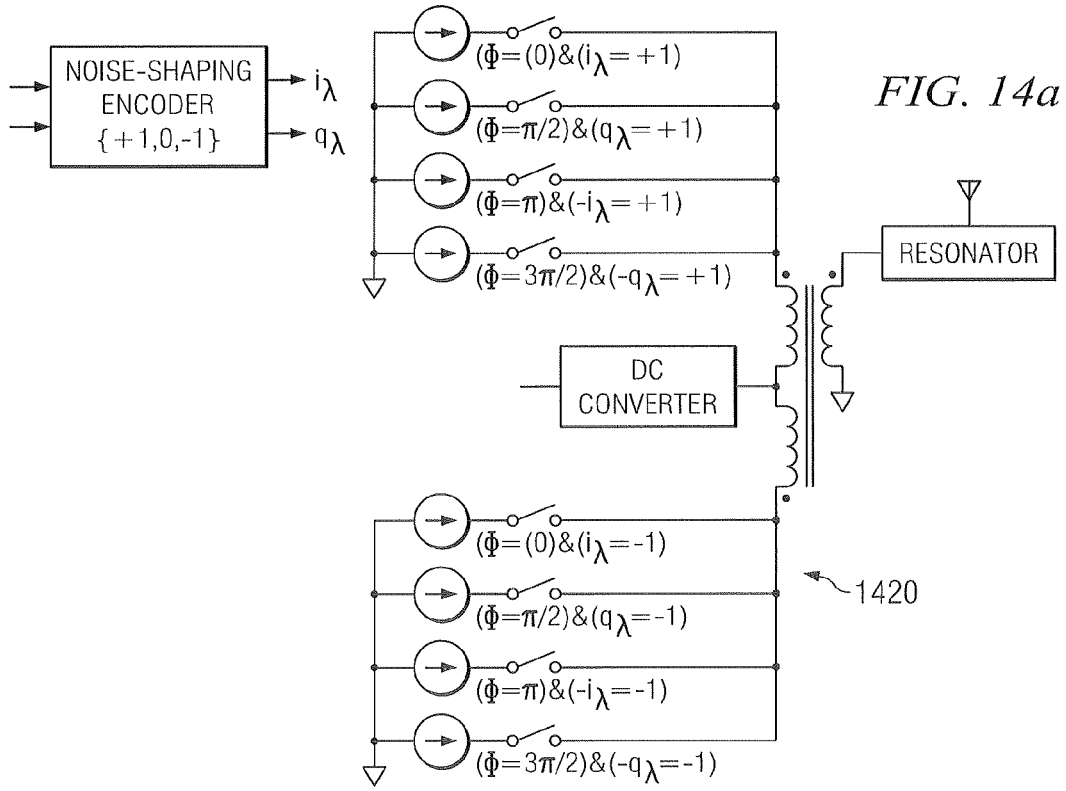
FIG. 14a is a functional block diagram of a portion of the circuit of FIG. 14, illustrating the use of a multi-finger configuration DAC.
Figure 14:
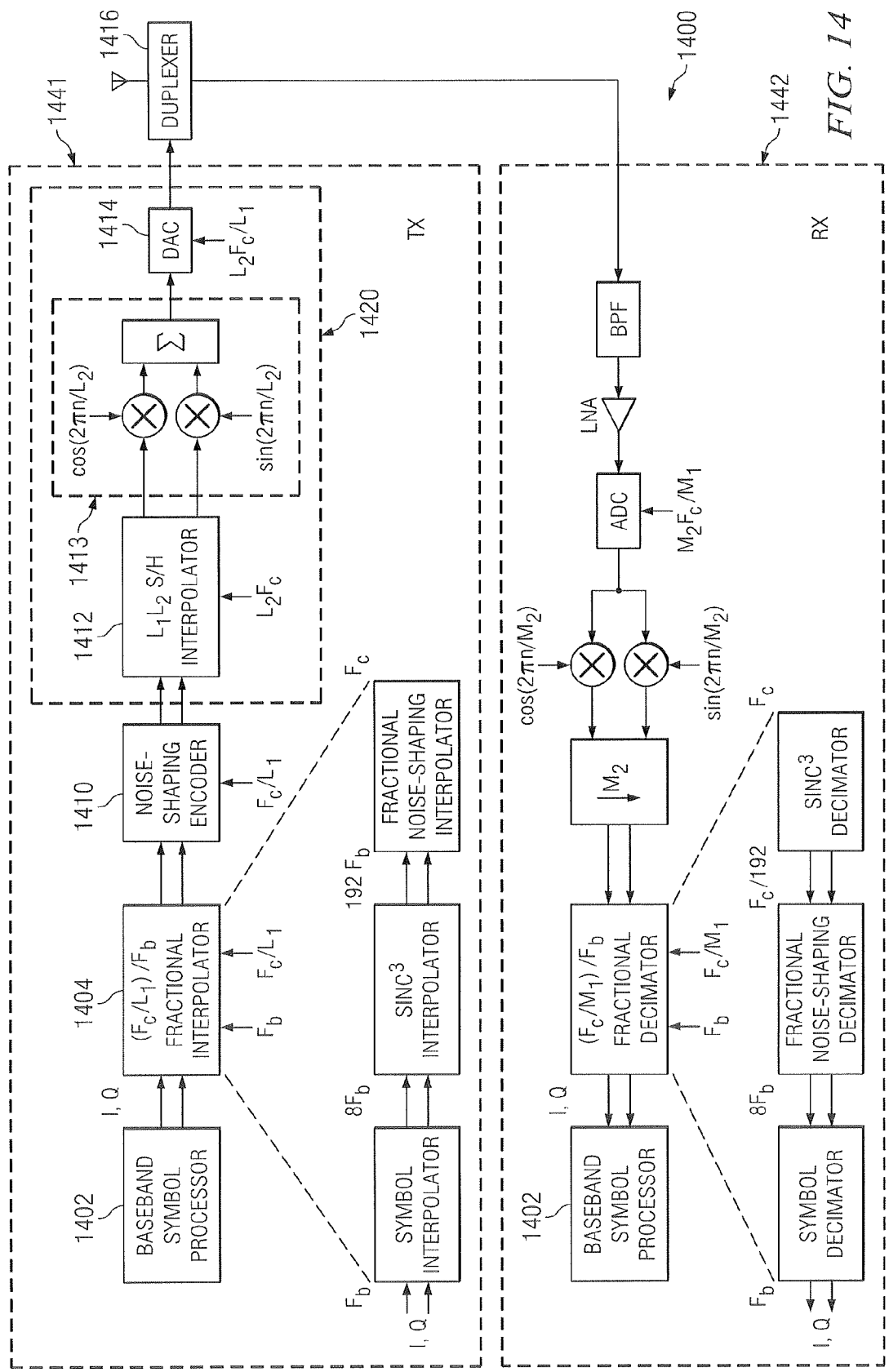
FIG. 14 is a functional block diagram of an exemplary wireless transmitter system utilizing the improved DAC of the present invention.

Referring now to FIGS. 14 and 14a, an exemplary radio frequency transceiver system utilizing the improved converter of the present invention is described.

In one embodiment, the transceiver 1400 comprises a baseband processor 1402, a fractional interpolator 1404 (such as that described in co-pending and co-owned U.S. patent application Ser. No. 10/910,910 entitled "NOISE SHAPED INTERPOLATOR AND DECIMATOR APPARATUS AND METHOD" previously incorporated herein), noise shaping coder (INSC) 1410, sample and hold interpolator 1412, a digital I/Q quadrature mixer and combiner 1413, and a high-efficiency DAC 1414 such as that described above. A resonator (not shown) is also utilized in conjunction with the duplexer 1416 to generate the analog output of the transmitter. As described in detail in co-owned and co-pending U.S. patent application Ser. No. 10/382,297 filed Mar. 4, 2003 previously incorporated herein, the interpolator, NSC, DAC and resonator cooperate to convert the digital in-phase (I) and quadrature (Q) signals obtained from the baseband processor directly to an analog representation at carrier frequency for transmission over an antenna in a highly power-efficient manner. In one variant, the transmitter is further adapted to dislocate quantization noise generated by the transmitter outside of one or more receive bands associated with a related receiver unit of the transmitter.

Prior art transmitters typically comprise baseband symbols (I and Q) being converted from digital to analog by a DAC operating at a baseband frequency, $f_b$, or a small integer multiple of $f_b$, e.g., 4 $f_b$ or 8 $f_b$. From that point onward in the signal path, the processing is typically in the analog domain, including the up-conversion process.

Alternatively, as described in the 10/382,297 application referenced above, the baseband symbols are digitally interpolated up to a sample rate at or substantially near the desired frequency, and then encoded. The encoding method may be performed by a delta-sigma modulator or noise-shaping coder. The output of the coder is represented by a coarsely quantized signal of one or more bits by an RDAC. The output of the RDAC is coupled to a bandpass filter or resonator, which is part of the duplexer in the exemplary embodiment of FIG. 14. A DC/DC converter (see FIG. 14a) may be used to control the bias level of the RDAC dynamically to improve power efficiency. One such way is described in the co-pending U.S. Provisional Patent Application Ser. No. 60/515,377 filed Oct. 28, 2003 and entitled "IMPROVED RADIO FREQUENCY ENVELOPE APPARATUS AND METHOD" which is incorporated herein by reference in its entirety. Overall, when compared with a conventional architecture, the use of the RDAC in the aforementioned circuit provides a lower resolution but higher speed, as opposed to higher resolution but lower speed of the prior art. When used in conjunction with noise-shaping digital coder, the desired resolution is achieved in one or more bands of interest through the principle of noise shaping, as described in the foregoing incorporated U.S. patent applications.

FIG. 14a illustrates an alternate implementation of the RDAC portion of the circuit 1400 of FIG. 14. FIG. 14a is comprised of the subcircuit 1420, which is comprised of Interpolator 1412, I/Q digital mixer and combiner 1413, and DAC 1414. Here, a ternary {−1, 0, +1} quantization encoder is used in conjunction with a plurality of DACs which substitute for a single DAC. Specifically, in this embodiment, each individual current source and corresponding switch in FIG. 14a, which form a single 'finger' or component of a larger current source as shown in the FIG. 14a, may be implemented as a controlled current source of FIGS. 2, 3, 5, 7, 11a-c or 12. This approach has the benefit of, inter alia, facilitating power control. Additional detail on the operation of this circuit is provided in the 10/382,297 application referenced above.

Although FIG. 14a includes a DAC having a unary weighted architecture and utilizing a plurality of the controlled current sources of the type shown in FIGS. 2, 3, 5, 7, 11a-c, and 12, it is understood that the controlled current source circuits of the present invention may be used in other DAC architectures, such as binary weighted DACs and segmented DACs.

It is further understood that the controlled current sources of FIGS. 2, 3, 5, 7, 11a-c and 12 may be implemented with other types of transistors.

Despite the utility of the RDAC of the present invention in a direct conversion type architecture, it can also be used in other applications. For example, in another embodiment (not shown), the transmitter comprises a traditional carrier-based architecture having a baseband processor, DAC, up-conversion apparatus. (from baseband to an intermediate frequency and then to carrier), power amplifier, and antenna. The DAC operates to receive digital I and Q signals from the baseband processor, and convert these signals to the analog domain for subsequent up-conversion, power amplification, and transmission over the antenna. Note that the higher speed and lower resolution of the embodiment of FIGS. 14 and 14a can be traded off for a more traditional functionality (i.e., lower speed and higher resolution) through proper adaptation of the circuit described previously herein.

FIG. 14 includes a receiver, subcircuit 1442, as well as a transmitter 1441. It will be appreciated that the receiver includes an ADC (analog-to-digital converter) function, which may include one or more elements or embodiments of the RDAC as described in the present invention disclosure. It is well known to those of ordinary skill that ADC's may include DAC's as part of the overall ADC function. Therefore, the virtues of the present invention can readily apply to a receiver and/or ADC, including without limitation delta-sigma and "flash" type ADCs.

It will be appreciated that the various circuits of the present invention may be rendered as stand-alone or discrete electronic circuits, as well as integrated circuit (IC) devices. Such integrated circuit devices may include, for example, system-on-chip (SoC) devices which integrate multiple functions or modules onto a single semiconductive die rendered in a sub-micron SiGe process. For example, in one embodiment of the present invention, the RDAC circuits are included with the digitally switched resonator, noise shaping coder, etc. of the direct-conversion architecture referenced above. Baseband processing may also optionally be included within this device. This highly integrated approach provides significant benefits in terms of size and compactness, power consumption, and ease of design and implementation. It also leverages one of the primary benefits of the exemplary direct-conversion architecture described above; i.e., simplification and obviation of many prior art RF amplifier and up-conversion/down-conversion components which would otherwise be provided as discrete devices.

It will be recognized that while certain aspects of the invention are described in terms of a specific sequence of steps of a method or ordering of components in an apparatus adapted to implement the methodology of the invention, these descriptions are only illustrative of the broader invention, and may be modified as required by the particular application.

Certain steps/components may be rendered unnecessary or optional under certain circumstances. Additionally, certain steps/components or functionality may be added to the disclosed embodiments, or the order of performance of two or more steps or components permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A circuit apparatus adapted to provide enhanced rising edge performance for current pulses, said circuit apparatus comprising:
   at least one output transistor; and
   at least one capacitor electrically disposed between a high speed control signal node of said circuit apparatus and the base of said at least one output transistor;
   wherein said at least one capacitor results in a rapid rising edge of said current pulses upon the application of a signal to said control signal node.

2. The apparatus of claim 1, further comprising:
   a first switch adapted to switch the base of said at least one output transistor to alternate ones of a plurality of voltages; and
   a second switch electrically coupled to said first switch and adapted to correct for a voltage drop associated with said first switch.

3. The apparatus of claim 2, wherein both said first and second switches and said at least one capacitor are scaled to as small a value as possible, while still providing said rapid rising edge.

4. The apparatus of claim 2, wherein at least one of said first and second switches comprises parallel combinations of NMOS and PMOS semiconductors.

5. The apparatus of claim 2, further comprising a reference bias transistor electrically coupled to said second switch.

6. The apparatus of claim 5, wherein said voltage drop, uncorrected, would produce a mismatch of a current mirror from said reference bias transistor to said output transistor.

7. The apparatus of claim 2, wherein said first and second switches are configured to cancel the clock, and cancel the charge associated with said switches.

8. Digital-to-analog conversion (DAC) apparatus comprising:
   a first transistor device having a collector and a base;
   a second transistor device disposed in series with said first device; and
   apparatus adapted to determine the collector-to-base current of said first device;
   wherein current of substantially the same magnitude as said collector-to-base current is injected into at least a portion of said first device in order to compensate for said collector-to-base current of said first device.

9. The apparatus of claim 8, wherein said current is injected into the collector of said first device.

10. The apparatus of claim 8, wherein said current is injected into the emitter of said first device.

11. The apparatus of claim 8, wherein said current is injected into the base of said first device.

12. The apparatus of claim 8, wherein said series disposition comprises a cascode disposition wherein the emitter of said first device electrically communicates with the collector of said second device.

13. The apparatus of claim 12, wherein said first device comprises a high voltage device, and said second device comprises a high speed device.

14. Avalanche-controlled digital-to-analog conversation (DAC) apparatus, comprising:
   first and second transistor devices disposed in cascode configuration, said first device having a collector and a base;
   apparatus adapted to determine the collector-to-base current of said first device; and
   a current source adapted to generate a second current substantially related to said collector-to-base current;
   wherein said second current is injected into at least a portion of said first device in order to compensate for avalanche multiplication between the collector and the base within said first device.

15. The apparatus of claim 14, further comprising capacitive current compensating circuitry adapted to substantially correct for capacitive currents generated within said apparatus.

16. Digital-to-analog conversion circuitry, comprising:
   a first sub-circuit having a high voltage device producing a substantially sinusoidal voltage profile at an output node thereof;
   a second sub-circuit operatively coupled to said first sub-circuit and comprising a second high voltage device, said device generating a current comprising first and second current components, said second component comprising a capacitive current related at least part to said output node voltage profile; and a transistor device used to sense only said second component and substantially subtract said second current component from said current generated by said second device.

17. A method of compensating for high voltage swing in a DAC circuit, comprising:
   providing a first circuit having a high output voltage device;
   providing a second circuit adapted for sensing a base current;
   providing a third circuit comprising:
      (i) a first device adapted to monitor an output voltage of said first circuit, the first device further adapted to generate a first current; and
      (ii) a second device adapted to sense a second current due to a voltage swing;
   subtracting the second current from the first current to obtain current representative of only the first current; and
   using the first current to compensate the high output voltage device.

18. A radio frequency transmitter comprising:
   a baseband processor capable of processing digital data and producing at least one output comprising processed digital data;
   a digital-to-analog converter adapted to receive said processed digital data and convert it to signals in the analog domain; and
   an antenna adapted to transmit at least a portion of said analog domain signals;

wherein said converter comprises:

at least one output transistor; and at least one capacitor electrically disposed between a high speed control signal node of said circuit and the base of said at least one output transistor;

wherein said at least one capacitor results in a rapid rising edge of current pulses associated with said signals upon the application of a control signal to said control signal node.

19. The transmitter of claim 18, further comprising a noise-shaped coder apparatus operatively communicating with said digital-to-analog converter.

20. The transmitter of claim 18, further comprising a resonator operatively coupled to said digital-to-analog converter.

* * * * *